(12) United States Patent
Wan

(10) Patent No.: US 11,374,073 B2
(45) Date of Patent: Jun. 28, 2022

(54) DISPLAY PANEL WITH AUXILIARY ELECTRODE AND MANUFACTURING METHOD THEREOF

(71) Applicant: SHENZHEN CHINA STAR OPTOELECTRONICS SEMICONDUCTOR DISPLAY TECHNOLOGY CO., LTD., Guangdong (CN)

(72) Inventor: Zhijun Wan, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/047,469

(22) PCT Filed: Aug. 31, 2020

(86) PCT No.: PCT/CN2020/112455
§ 371 (c)(1),
(2) Date: Oct. 14, 2020

(87) PCT Pub. No.: WO2022/032741
PCT Pub. Date: Feb. 17, 2022

(65) Prior Publication Data
US 2022/0052132 A1 Feb. 17, 2022

(30) Foreign Application Priority Data
Aug. 11, 2020 (CN) .......................... 202010799550.X

(51) Int. Cl.
*H01L 29/08* (2006.01)
*H01L 27/32* (2006.01)
(Continued)

(52) U.S. Cl.
CPC ...... *H01L 27/3246* (2013.01); *H01L 51/5056* (2013.01); *H01L 51/5072* (2013.01); *H01L 51/5092* (2013.01); *H01L 51/56* (2013.01)

(58) Field of Classification Search
CPC .................................................. H01L 27/3246
See application file for complete search history.

(56) References Cited

U.S. PATENT DOCUMENTS 10,153,333 B1   12/2018   Li
10,483,499 B2 * 11/2019   Wang .................. H01L 51/0097
(Continued)

FOREIGN PATENT DOCUMENTS

CN   103489890 A   1/2014
CN   103855184 A   6/2014
(Continued)

*Primary Examiner* — Caleb E Henry
(74) *Attorney, Agent, or Firm* — The Roy Gross Law Firm, LLC; Roy Gross

(57) ABSTRACT

The present disclosure provides a display panel and a manufacturing method of the display panel. The display panel includes an array substrate, a first electrode, a pixel definition layer, an organic functional layer, a second electrode, a covering layer, and an auxiliary electrode. By arranging an auxiliary cathode in a non-display area and using a parallel connection of the auxiliary cathode and a cathode, a cathode resistance of devices is reduced to relieve an IR-drop phenomenon and improve a brightness uniformity of the panel. The present disclosure provides the manufacturing method of the display panel. An organic material can be patterned to form the covering layer without using a fine mask, and a metal material can be patterned to form the auxiliary electrode by utilizing characteristics of self-assembled materials, thereby reducing production costs.

5 Claims, 3 Drawing Sheets

(51) Int. Cl.
    *H01L 51/50*     (2006.01)
    *H01L 51/56*     (2006.01)

(56) References Cited

U.S. PATENT DOCUMENTS

| | | |
|---|---|---|
| 2014/0145152 A1 | 5/2014 | Chung et al. |
| 2014/0145156 A1 | 5/2014 | Choi |
| 2015/0034913 A1 | 2/2015 | Yoon |
| 2015/0194638 A1 | 7/2015 | Choi et al. |
| 2016/0218321 A1 | 7/2016 | Choi et al. |
| 2017/0125723 A1* | 5/2017 | Moon ................. H01L 51/5209 |
| 2017/0194605 A1* | 7/2017 | Kuji ........................ H01L 51/56 |
| 2019/0006427 A1* | 1/2019 | Lu ...................... H01L 51/5228 |
| 2019/0067390 A1* | 2/2019 | Gao .................... H01L 27/3279 |
| 2019/0288044 A1* | 9/2019 | Hou ........................ H01L 27/32 |
| 2020/0203446 A1* | 6/2020 | Luo .................... H01L 27/3279 |

FOREIGN PATENT DOCUMENTS

| | | |
|---|---|---|
| CN | 104218051 A | 12/2014 |
| CN | 107565063 A | 1/2018 |
| CN | 110931653 A | 3/2020 |
| KR | 102092924 B1 | 3/2020 |

\* cited by examiner

DISPLAY PANEL WITH AUXILIARY ELECTRODE AND MANUFACTURING METHOD THEREOF

FIELD OF INVENTION

The present disclosure relates to the field of display technologies, and particularly relates to a large-sized and top-emitting organic light emitting diode (OLED) display panel and a manufacturing method of the display panel.

Background of Invention

Organic light-emitting diode (OLED) display devices mainly include a bottom-emitting type (emitting light downward from a substrate) and a top-emitting type (emitting the light upward relative to the substrate). Compared with bottom-emitting typed OLEDs, top-emitting typed OLEDs do not emit the light through the substrate, and the light is emitted from above devices, pixel circuit designs on the substrate do not affect a luminous area of the devices, thereby preventing competition between an area of thin film transistors (TFTs) and metal circuits and the luminous area, so an aperture ratio of panels can be effectively improved, and OLED display panels with high brightness and high resolution can be manufactured. Meanwhile, an operating voltage of top-emitting typed OLEDs is lower under a same brightness, so that a service life of the devices is longer and power consumption is lower.

Technical Problems

In top-emitting OLED display devices, because light needs to pass through a cathode of the devices, in order to ensure a luminous rate, a transparency of the cathode should be increased. In prior art, the cathode of the top-emitting OLED devices is generally made of low-power functional metal or alloy (such as Ag or magnesium silver alloy), or transparent conductive oxide (TCO, such as IZO). However, above two kinds of cathodes inevitably arise a problem of high cathode sheet resistance. By using metal or alloy as the cathode of the devices, in order to prevent an influence of the cathode on a light extraction rate, the cathode is made thinner; while using the transparent conductive oxide as the cathode of the devices, the cathode is not needed to make very thin due to high transparency of material itself.

For a large-sized and top-emitting OLED display panel, the cathode sheet resistance of the devices is too large, a voltage drop (IR-drop) of the panel is serious, the farther away from a power supply on the pane, the more serious the voltage drop may be, thereby resulting in a large difference in brightness between a periphery of the panel and a center of the panel and resulting in a serious uneven brightness phenomenon on the panel. In a position where the brightness of the panel is too large, a panel heating is too large, which is easy to affect a normal operation of a thin film transistor (TFT) substrate. Moreover, the cathode sheet resistance is too large, a driving voltage of OLED devices is large, and a power consumption of the panel is increased.

TECHNICAL SOLUTIONS

One of purposes of the present disclosure is to provide a display panel, by arranging an auxiliary cathode in a non-display area and by using a parallel connection of the auxiliary cathode and the cathode, the cathode resistance of the devices is reduced to relieve an IR-Drop phenomenon and improve a brightness uniformity of the panel.

The display panel includes: an array substrate including a display area and a non-display area; a first electrode disposed on the array substrate and corresponding to the display area; a pixel definition layer disposed on the array substrate and corresponding to the non-display area; an organic functional layer disposed on the first electrode and the pixel definition layer; a second electrode disposed on the organic functional layer; a covering layer disposed on the second electrode and corresponding to the display area; and an auxiliary electrode disposed on the second electrode and corresponding to the non-display area, wherein the auxiliary electrode is connected in parallel with the second electrode.

Furthermore, a material of the covering layer includes an organic material; and a material of the auxiliary electrode includes a metal material.

Furthermore, the organic functional layer includes: a light-emitting function layer disposed on the first electrode; and an electron transport layer disposed on the light-emitting function layer and the pixel definition layer.

Furthermore, the organic functional layer includes: a hole injection layer; a hole transport layer disposed on the hole injection layer; and a light-emitting layer disposed on the hole transport layer.

Furthermore, the pixel definition layer includes: a first layer, wherein edges of the first layer cover the first electrode; and a second layer disposed on the first layer.

Another purpose of the present disclosure is to provide a manufacturing method of the display panel, the organic material can be patterned to form a covering layer without using a fine mask, and the metal material can be patterned to form the auxiliary electrode by utilizing the characteristics of self-assembled materials, thereby reducing production costs.

The manufacturing method of a display panel includes: providing an array substrate and a mask, wherein the array substrate includes a display area and a non-display area, the mask includes a light transmitting area and a non-light transmitting area; forming a first electrode on the array substrate, wherein the first electrode corresponds to the display area; forming a pixel definition layer on the array substrate, wherein the pixel definition layer corresponds to the non-display area; forming an organic functional layer on the first electrode and the pixel definition layer; forming a second electrode on the organic functional layer; vacuum evaporating an organic material on the second electrode; setting the mask above the array substrate, wherein the light transmitting area corresponds to the non-display area, and the non-light transmitting area corresponds to the display area; irradiating the mask with a laser, wherein light is transmitted through the light transmitting area to the organic material in the non-display area, the organic material in the non-display area absorbs high energy to sublimate into a gaseous state, gaseous molecules are condensed into a film in the light transmitting area, and the organic material in the display area forms a covering layer; and forming an auxiliary electrode on the second electrode of the non-display area, wherein the auxiliary electrode is connected in parallel with the second electrode.

Furthermore, the step of forming the auxiliary electrode on the second electrode of the non-display area specifically includes: vacuum evaporating a metal material on the display area and the non-display area, wherein due to repulsion between the organic material in the display area and the metal material, the metal material spontaneously forms a film in the non-luminescent area to form the auxiliary electrode.

Furthermore, the mask includes: a light transmitting substrate including alignment marks; a masking layer disposed on the light transmitting substrate and corresponding to the non-light transmitting area; and a limiting frame arranged around the light transmitting substrate and surrounding the covering layer.

Furthermore, the step of setting the mask above the array substrate includes: making the alignment marks of the mask correspond to alignment marks of the array substrate, wherein a side of the masking layer faces the array substrate, and the limiting frame is arranged at a periphery of the array substrate.

Furthermore, in the step of forming the pixel definition layer on the array substrate of the non-display area, a double-layered pixel definition layer is manufactured by using two yellow light processes; and in a step of forming the organic functional layer on the first electrode and the pixel definition layer, the organic functional layer is manufactured by a method of inkjet printing.

BENEFICIAL EFFECTS

Beneficial effects of the present disclosure are: the present disclosure provides a display panel and a manufacturing method of the display panel. By arranging an auxiliary cathode in a non-display area and using a parallel connection of the auxiliary cathode and a cathode, a cathode resistance of devices is reduced to relieve an IR-drop phenomenon and improve a brightness uniformity of a panel. The present disclosure provides the manufacturing method of the display panel, the organic material can be patterned to form a covering layer without using a fine mask, and a metal material can be patterned to form the auxiliary electrode by utilizing characteristics of self-assembled materials, thereby reducing production costs.

DESCRIPTION OF DRAWINGS

The technical solutions, as well as other beneficial advantages, of the present disclosure will be apparent from the following detailed descriptions of embodiments of the present disclosure, with reference to the attached drawings.

Figure 1:
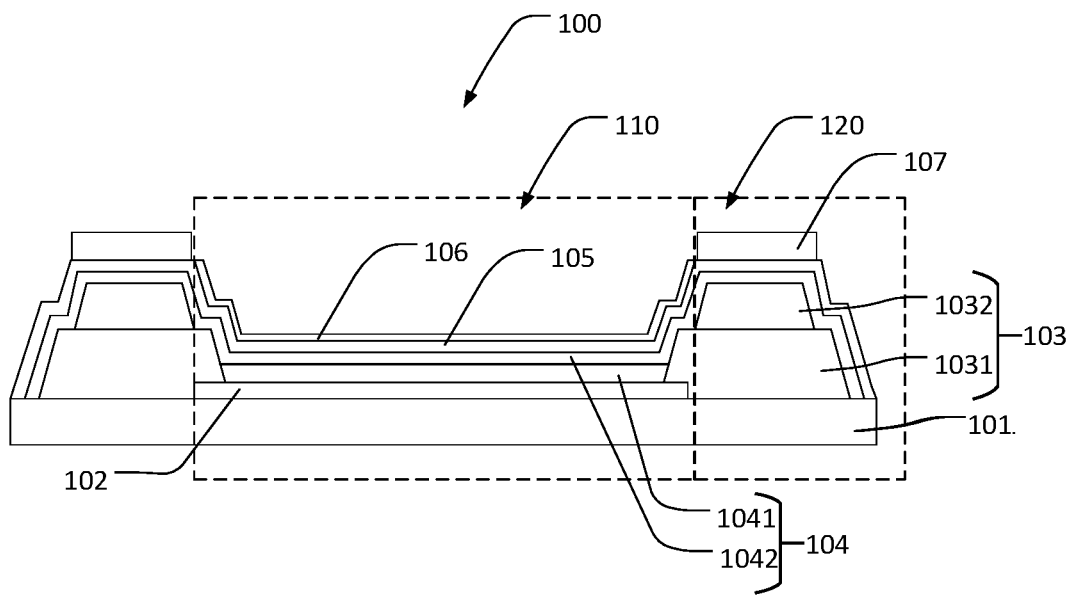
FIG. 1 is a schematic structural diagram of a display panel provided by the present disclosure.

display panel 100; array substrate 101; first electrode 102, pixel definition layer 103;

organic functional layer 104; second electrode 105; covering layer 106;

auxiliary electrode 107; first layer 1031; second layer 1032;

light-emitting function layer 1041; electron transport layer 1042; display area 110;

non-display area 120.

DETAILED DESCRIPTION OF EMBODIMENTS

The specific structure and functional details disclosed herein are only representative, and are used for the purpose of describing exemplary embodiments of the present disclosure. However, the present disclosure can be implemented in many alternative forms, and should not be interpreted as being limited to the embodiments described herein.

In the description of the present disclosure, it should be understood that terms such as "center," "lateral," "upper," "lower," "front," "rear," "left," "right," "vertical," "horizontal," "top," "bottom," "inside," "outside," as well as derivative thereof should be construed to refer to the orientation as then described or as shown in the drawings under discussion. These relative terms are for convenience of description, do not require that the present disclosure be constructed or operated in a particular orientation, and shall not be construed as causing limitations to the present disclosure. In addition, terms such as "first" and "second" are used herein for purposes of description and are not intended to indicate or imply relative importance or significance. Thus, features limited by "first", and "second". are intended to indicate or imply including one or more than one these features. In the description of the present disclosure, "a plurality of" relates to two or more than two, unless otherwise specified. In addition, the term "including" and any variations thereof are intended to cover non-exclusive inclusion.

In the description of the present disclosure, it should be noted that unless there are express rules and limitations, the terms such as "mount," "connect," and "bond" should be comprehended in broad sense. For example, it can mean a support connection, a detachable connection, or an integrated connection. It can mean a mechanical connection or an electrical connection. It can mean a direct connection, an indirect connection by an intermediate, or an inner communication. Those skilled in the art should understand the specific meanings in the present disclosure according to specific situations.

The terms used herein are only for describing specific embodiments and are not intended to limit the exemplary embodiments. Unless the context clearly dictates otherwise, the singular forms "a" and "one" used herein are also intended to include the plural. It should also be understood that the terms "including" and/or "comprising" used herein specify the existence of the stated features, integers, steps, operations, units and/or components, and do not exclude the existence or addition of one or more Other features, integers, steps, operations, units, components, and/or combinations thereof.

As shown in FIG. 1, the present disclosure provides a display panel 100 including an array substrate 101, a first electrode 102, a pixel definition layer 103, an organic functional layer 104, a second electrode 105, a covering layer 106, and an auxiliary electrode 107.

The array substrate 101 includes a display area 110 and a non-display area 120.

The first electrode 102 is disposed on the array substrate 101 and corresponding to the display area 110, the first electrode 102 is an anode.

The pixel definition layer 103 is disposed on the array substrate 101 and corresponding to the non-display area 120.

The pixel definition layer 103 surrounds the first electrode 102, an area defined by the pixel definition layer 103 is a light-emitting area of the panel, that is, a sub-pixel area.

The organic functional layer 104 is disposed on the first electrode 102 and the pixel definition layer 103.

The organic functional layer 104 includes a light-emitting function layer 1041 and an electron transport layer 1042.

The light-emitting function layer 1041 is disposed on the first electrode 102.

The light-emitting function layer 1041 includes a hole injection layer, a hole transport layer, and a light-emitting layer.

The hole transport layer is disposed on the hole injection layer, the light-emitting layer is disposed on the hole transport layer, and the electron transport layer 1042 is disposed on the light-emitting function layer 1041 and the pixel definition layer 103.

The second electrode 105 is disposed on the organic functional layer 104, the second electrode 105 includes a cathode.

The covering layer 106 is disposed on the second electrode 105 and corresponding to the display area 110.

The auxiliary electrode 107 is disposed on the second electrode 105 and corresponding to the non-display area 120, the auxiliary electrode 107 is connected in parallel with the second electrode 105.

A material of the covering layer 106 includes an organic material, and a material of the auxiliary electrode 107 includes a metal material.

The covering layer 106 is manufactured in the display area 110 by vacuum evaporating the organic material and combined with an ordinary mask. The organic material in the non-display area 120 absorbs high energy to sublimate into a gaseous state, gaseous molecules are condensed into a film on a mask, thus the organic material in a non-luminescent area is transferred to the mask.

The auxiliary electrode 107 is manufactured by vacuum evaporating the metal material on an entire surface of the display area 110 and the non-display area 120, due to repulsion between the metal material evaporated in the display area 110 and the organic material in the display area 110, the metal material spontaneously forms a film in the non-luminescent area to form the auxiliary electrode 107.

In an embodiment, the pixel definition layer 103 includes a first layer 1031 and a second layer 1032.

Edges of the first layer 1031 cover the first electrode 102, the second layer 1032 is disposed on the first layer 1031. A double-layered pixel definition layer 103 is preferred by the present disclosure, which can better define the organic material in the display area 110.

Figure 2:
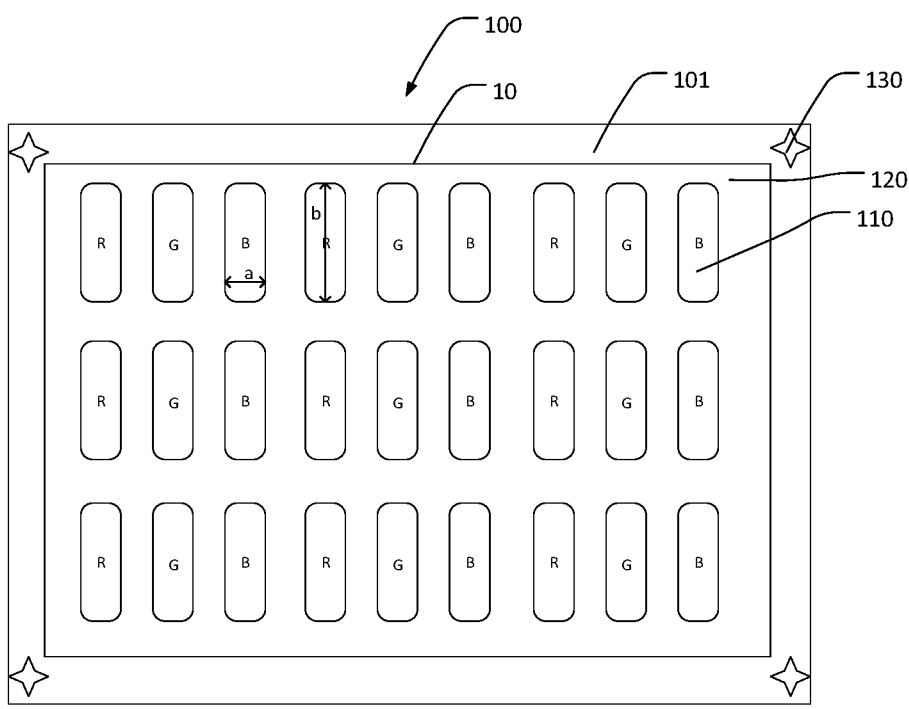
FIG. 2 is a schematic plan diagram of a display panel provided by the present disclosure.

FIG. 2 is a plan diagram of the display panel 100. Alignment marks 130 are arranged at four corners of a periphery of the array substrate 101, the display area 110 includes sub-pixels arranged in an array, the sub-pixels include red sub-pixel R, green sub-pixel G, and blue sub-pixel B.

Wherein, a width and a length of a single sub-pixel on the display panel 100 are a and b, respectively.

The present disclosure provides the display panel 100. By arranging the auxiliary cathode in the non-display area 120 and using a parallel connection of the auxiliary cathode and the cathode, a cathode resistance of devices is reduced to relieve an IR-drop phenomenon and improve a brightness uniformity of the panel.

The present disclosure further provides a manufacturing method of a display panel, including following steps S1-S9.

Figure 3:
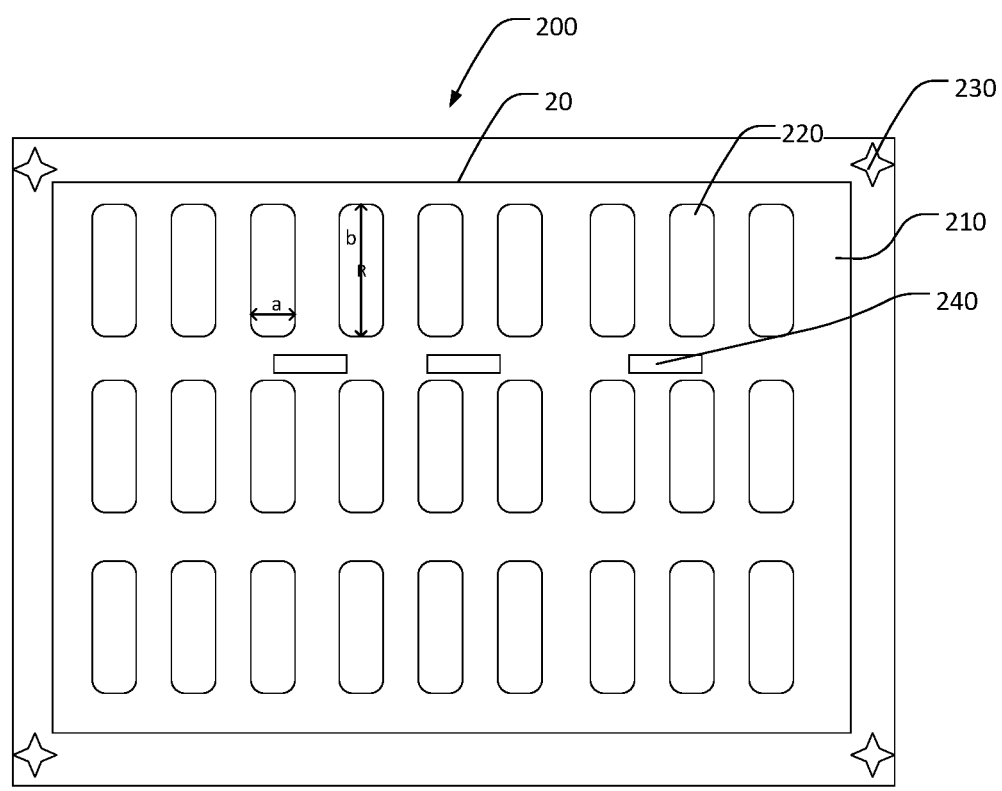
FIG. 3 is a schematic plan diagram of a mask provided by the present disclosure.
Figure 4:
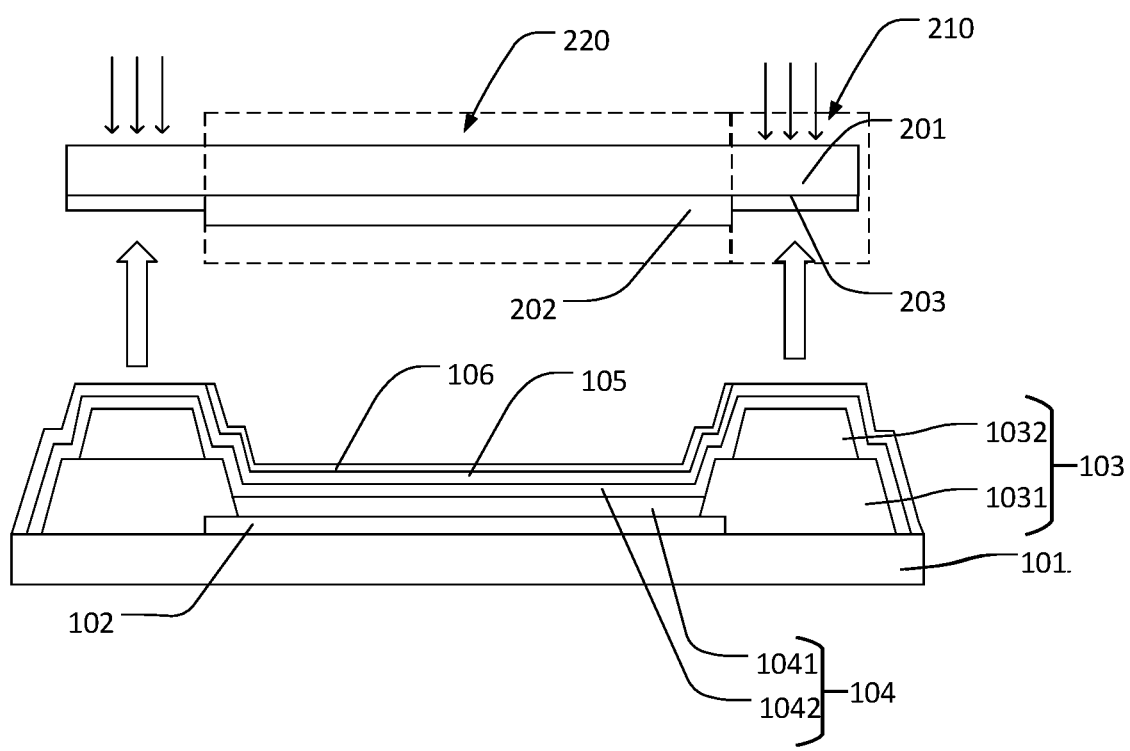
FIG. 4 is a schematic structural diagram of steps S7-S8 in a manufacturing method of a display panel provided by the present disclosure.

S1, providing an array substrate 101 and a mask, wherein the array substrate 101 includes a display area 110 and a non-display area 120, as shown in FIG. 3 and FIG. 4, the mask includes a light transmitting area 210 and a non-light transmitting area 220.

The mask further includes a light transmitting substrate 201, a masking layer 202, a limiting support column 240, and a limiting frame 20.

There are alignment marks 230 around the transparent substrate 201. A material of the light transmitting substrate 201 includes substrates with high transparency, such as quartz, glass, and plastic film, etc.

The masking layer 202 is disposed on the light transmitting substrate 201 and corresponding to the non-light transmitting area 220.

A material of the masking layer 202 includes low-light transmitting material such as metal, etc.

The masking layer 202 may be formed by a yellow light process, specifically, a low-light transmitting metal material is deposited on the light transmitting substrate 201, and then the masking layer 202 is patterned by the yellow light process.

In an embodiment, each unit of the masking layer 202 respectively corresponds to a sub-pixel unit in FIG. 2, that is, a shape of each unit of the masking layer 202 is the same as a shape of the sub-pixel unit, and a position of each unit of the masking layer 202 is the same as a position of the sub-pixel unit.

A width and a length of each unit of the masking layer 202 are a' and b', respectively, a size relationship between each unit of the masking layer 202 and the sub-pixel unit is $a'>0.8 a$ and $b'>0.8 b$ (referring to FIG. 2).

In other embodiments, if sizes of the sub-pixels on the display panel 100 are different, sizes of each unit of the masking layer 202 also need to be different correspondingly.

The limiting frame 20 is arranged around the light transmitting substrate 201 and surrounds the covering layer 202. The limiting frame 20 corresponds to an effective area of the display panel 100 (referring to an area 10 in FIG. 2).

In the present disclosure, both a shape and a size of the limiting support column 240 are unlimited, a position of the limiting support column 240 must be in the non-light transmitting area 220, a height of the limiting frame 20 is consistent with a height of the limiting support column 240 to ensure that a distance between the mask and the display panel 100 is consistent everywhere.

S2, forming a first electrode 102 on the array substrate 101 in the display area 110, the first electrode 102 is an anode.

Specifically, a metal material is deposited on the array substrate 101 and is patterned in the display area 110 to form the first electrode 102.

S3, forming a pixel definition layer 103 on the array substrate 101 in the non-display area 120, wherein an area defined by the pixel definition layer 103 is a light-emitting area of a panel, that is, a sub-pixel area.

In the step of forming the pixel definition layer 103 on the array substrate 101 of the non-display area 120, a double-layered pixel definition layer 103 is manufactured by using two yellow light processes.

Specifically, a two-layered material layer is arranged on the array substrate 101, the second layer 1032 is firstly formed by a first yellow light process, and then a second yellow light process is used to form a double-layered structure by borrowing a pattern of the second layer 1032.

S4, forming an organic functional layer 104 on the first electrode 102 and the pixel definition layer 103.

Specifically, in a step of forming the organic functional layer 104 on the first electrode 102 and the pixel definition layer 103, specifically including following steps S401-S402.

The organic functional layer 104 is manufactured by a method of inkjet printing.

S401, forming the organic functional layer 104 on the first electrode 102, specifically including following steps S4011-S4013.

S4011, forming a hole injection layer on the first electrode 102;

S4012, forming a hole transport layer on the hole injection layer; and

S4013, forming a light-emitting layer on the hole transport layer.

S402, forming an electron transport layer 1042 on the light-emitting function layer 1041 and the pixel definition layer 103.

S5, forming a second electrode 105 on the organic functional layer 104.

Specifically, the second electrode 105 is formed in the non-display area 120 by depositing the metal material in the display area 110 and the non-display area 120 and by patterning the metal material in the non-display area 120.

S6, vacuum evaporating an organic material on the second electrode 105.

S7, as shown in FIG. 4, setting the mask above the array substrate 101, wherein the light transmitting area corresponds to the non-display area 120, and the non-light transmitting area corresponds to the display area 110.

The step of setting the mask above the array substrate specifically includes:

making the alignment marks 230 of the mask correspond to alignment marks 130 of the array substrate 101, wherein a side of the masking layer 202 faces the array substrate 101, the limiting frame 20 is arranged at a periphery of the array substrate 101.

S8, irradiating the mask with a laser, wherein light is transmitted through the light transmitting area 201 to the organic material in the non-display area 120, the organic material in the non-display area 120 absorbs high energy to sublimate into a gaseous state, gaseous molecules are condensed into a film in the light transmitting area (the mark 203 in FIG. 4 is a condensation film of the organic material), and the organic material in the display area 110 forms a covering layer 106.

In an embodiment, the step S8 needs to be performed in a vacuum environment, because the laser is irradiated on the organic material in the vacuum environment, the organic material is easier to sublime, and effects may be better.

In addition, because the organic material is deposited on the second electrode 105, due to differences between the organic material and the metal material, when the laser is used to remove the organic material in the non-display area 120, the organic material can be removed more easily and the metal material is not easily damaged, a process window of the laser has a wider selection range.

S9, forming an auxiliary electrode 107 on the second electrode 105 of the non-display area 120, wherein the auxiliary electrode 107 is connected in parallel with the second electrode 105.

The step of forming the auxiliary electrode 107 on the second electrode 105 of the non-display area 120 specifically includes as follows:

vacuum evaporating the metal material on the display area 110 and the non-display area 120, wherein due to repulsion between the organic material in the display area 110 and the metal material, the metal material spontaneously forms a film in the non-luminescent area to form the auxiliary electrode 107.

The present disclosure provides the manufacturing method of the display panel, the organic material can be patterned to form the covering layer 106 without using a fine mask, and the metal material can be patterned to form the auxiliary electrode 107 by utilizing characteristics of self-assembled materials, thereby reducing production costs.

In summary, although the present disclosure has been disclosed as above with preferred embodiments, the above preferred embodiments are not intended to limit the present invention. Those of ordinary skill in the art can make various changes and retouching without departing from the spirit and scope of the present disclosure. Therefore, a protection scope of the present disclosure is subject to a scope defined by the claims.

What is claimed is:

1. A manufacturing method of a display panel, comprising following steps:
    providing an array substrate and a mask, wherein the array substrate comprises a display area and a non-display area, the mask comprises a light transmitting area and a non-light transmitting area;
    forming a first electrode on the array substrate, wherein the first electrode corresponds to the display area;
    forming a pixel definition layer on the array substrate, wherein the pixel definition layer corresponds to the non-display area;
    forming an organic functional layer on the first electrode and the pixel definition layer;
    forming a second electrode on the organic functional layer;
    vacuum evaporating an organic material on the second electrode;
    setting the mask above the array substrate, wherein the light transmitting area corresponds to the non-display area, and the non-light transmitting area corresponds to the display area;
    irradiating the mask with a laser, wherein light is transmitted through the light transmitting area to the organic material in the non-display area, the organic material in the non-display area absorbs high energy to sublimate into a gaseous state, gaseous molecules are condensed into a film in the light transmitting area, and the organic material in the display area forms a covering layer; and
    forming an auxiliary electrode on the second electrode of the non-display area, wherein the auxiliary electrode is connected in parallel with the second electrode.

2. The manufacturing method of the display panel in claim 1, wherein:
    the step of forming the auxiliary electrode on the second electrode of the non-display area specifically comprises:
    vacuum evaporating a metal material on the display area and the non-display area, wherein due to repulsion between the organic material in the display area and the metal material, the metal material spontaneously forms a film in the non-display area to form the auxiliary electrode.

3. The manufacturing method of the display panel in claim 1, wherein:
    the mask comprises:
    a light transmitting substrate comprising alignment marks;
    a masking layer disposed on the light transmitting substrate and corresponding to the non-light transmitting area; and
    a limiting frame arranged around the light transmitting substrate and surrounding the covering layer.

4. The manufacturing method of the display panel in claim 3, wherein:
    the step of setting the mask above the array substrate comprises:
    making the alignment marks of the mask correspond to alignment marks of the array substrate, wherein a side of the masking layer faces the array substrate, and the limiting frame is arranged at a periphery of the array substrate.

5. The manufacturing method of the display panel in claim 1, wherein:
   in the step of forming the pixel definition layer on the array substrate of the non-display area, a double-layered pixel definition layer is manufactured by using two yellow light processes; and
   in the step of forming the organic functional layer on the first electrode and the pixel definition layer, the organic functional layer is manufactured by a method of inkjet printing.

\* \* \* \* \*